United States Patent
Jung

(10) Patent No.: US 8,878,158 B2
(45) Date of Patent: Nov. 4, 2014

(54) LIGHT EMITTING DEVICE, LIGHT EMITTING DEVICE PACKAGE, AND LIGHTING SYSTEM

(75) Inventor: Myung Hoon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 884 days.

(21) Appl. No.: 13/079,388

(22) Filed: Apr. 4, 2011

(65) Prior Publication Data

US 2011/0240958 A1    Oct. 6, 2011

(30) Foreign Application Priority Data

Apr. 5, 2010   (KR) .................. 10-2010-0030941

(51) Int. Cl.
| | | |
|---|---|---|
| H01L 33/06 | (2010.01) | |
| H01L 29/06 | (2006.01) | |
| H01L 33/22 | (2010.01) | |
| H01L 33/32 | (2010.01) | |
| H01L 33/00 | (2010.01) | |
| H01L 33/04 | (2010.01) | |
| H01L 33/02 | (2010.01) | |

(52) U.S. Cl.
CPC .............. *H01L 33/22* (2013.01); *H01L 33/32* (2013.01); *H01L 33/0079* (2013.01); *H01L 33/04* (2013.01); *H01L 33/025* (2013.01)
USPC .............................................. 257/13; 257/99

(58) Field of Classification Search
CPC ........ H01L 33/04; H01L 33/22; H01L 33/025
USPC ............... 257/88–103, E33.025, E33.067, 13
See application file for complete search history.

(56) References Cited

U.S. PATENT DOCUMENTS

| | | | |
|---|---|---|---|
| 7,601,979 B2 | 10/2009 | Miki et al. | |
| 2006/0157717 A1* | 7/2006 | Nagai et al. | ...................... 257/81 |
| 2007/0257269 A1* | 11/2007 | Cho et al. | ......................... 257/95 |
| 2008/0067497 A1 | 3/2008 | Kim | |
| 2009/0267098 A1* | 10/2009 | Choi | ............................... 257/98 |
| 2009/0278145 A1* | 11/2009 | Sakai | .............................. 257/98 |
| 2014/0145205 A1 | 5/2014 | Kong et al. | |

FOREIGN PATENT DOCUMENTS

| | | |
|---|---|---|
| JP | 2007-123731 A | 5/2007 |
| JP | 2009-164648 A | 7/2009 |
| KR | 10-0634306 A | 10/2006 |
| KR | 10-0784065 B1 | 12/2007 |
| KR | 10-2008-0074474 A | 8/2008 |
| KR | 10-2009-0018458 A | 2/2009 |
| KR | 10-2009-0112307 A | 10/2009 |
| WO | WO 2007/096405 A1 | 8/2007 |
| WO | WO 2008/130140 A1 | 10/2008 |

* cited by examiner

*Primary Examiner* — Cuong Q Nguyen
(74) *Attorney, Agent, or Firm* — Birch, Stewart, Kolasch & Birch, LLP

(57) ABSTRACT

A light emitting device according to the embodiment includes a conductive support substrate; a second conductive semiconductor layer on the conductive support substrate; an active layer on the second conductive semiconductor layer; a first conductive semiconductor layer on the active layer, the first conductive semiconductor layer including a GaN layer, an InGaN layer, and a roughness formed with selectively removed the GaN and InGaN layers; and an electrode layer on the first conductive semiconductor layer.

17 Claims, 11 Drawing Sheets

LIGHT EMITTING DEVICE, LIGHT EMITTING DEVICE PACKAGE, AND LIGHTING SYSTEM

The present application claims priority under 35 U.S.C. 119 to Korean Patent Application No. 10-2010-0030941 filed on Apr. 5, 2010, which is hereby incorporated by reference in its entirety.

BACKGROUND

The embodiment relates to a light emitting device, a method of fabricating the same, a light emitting device package and a lighting system.

A light emitting diode (LED) is a semiconductor light emitting device that converts current into light.

A wavelength of light emitted from the LED may vary depending on a semiconductor material used for fabricating the LED. This is because the wavelength of the emitted light varies depending on the bandgap of the semiconductor material, that is, the energy difference between valance band electrons and conduction band electrons.

The LED can generate light having high brightness, so that the LED has been extensively used as a light source for a display device, a vehicle, or a lighting device. In addition, the LED can represent a white color having superior light efficiency by employing luminescence materials or combining LEDs having various colors.

BRIEF SUMMARY

The embodiment provides a light emitting device having a novel structure, a method of fabricating the same, a light emitting device package and a lighting system.

The embodiment provides a light emitting device capable of improving the light extraction efficiency, a method of fabricating the same, a light emitting device package and a lighting system.

The embodiment provides a light emitting device capable of improving the internal quantum efficiency, a method of fabricating the same, a light emitting device package and a lighting system.

A light emitting device according to the embodiment comprises a conductive support substrate; a second conductive semiconductor layer on the conductive support substrate; an active layer on the second conductive semiconductor layer; a first conductive semiconductor layer on the active layer, the first conductive semiconductor layer comprising a GaN layer, an InGaN layer, and a roughness formed with selectively removed the GaN and InGaN layers; and an electrode layer on the first conductive semiconductor layer.

A light emitting device package according to the embodiment comprises a body; a first and second electrode layers on the body; a light emitting device electrically connected to the first and second electrode layers on the body; and a molding member surrounding the light emitting device on the body, wherein the light emitting device comprises a conductive support substrate; a second conductive semiconductor layer on the conductive support substrate; an active layer on the second conductive semiconductor layer; a first conductive semiconductor layer on the active layer, the first conductive semiconductor layer comprising a GaN layer, an InGaN layer, and a roughness formed with selectively removed the GaN and InGaN layers; and an electrode layer on the first conductive semiconductor layer.

A lighting system according to the embodiment comprises a board; and a light emitting module comprising a light emitting device on the board, wherein the light emitting device comprises a conductive support substrate; a second conductive semiconductor layer on the conductive support substrate; an active layer on the second conductive semiconductor layer; a first conductive semiconductor layer on the active layer, the first conductive semiconductor layer comprising a GaN layer, an InGaN layer, and a roughness formed with selectively removed the GaN and InGaN layers; and an electrode layer on the first conductive semiconductor layer.

The embodiment can provide a light emitting device having a novel structure, a method of fabricating the same, a light emitting device package and a lighting system.

The embodiment can provide a light emitting device capable of improving the light extraction efficiency, a method of fabricating the same, a light emitting device package and a lighting system.

The embodiment can provide a light emitting device capable of improving the internal quantum efficiency, a method of fabricating the same, a light emitting device package and a lighting system.

DETAILED DESCRIPTION OF THE EMBODIMENTS

Figure 1:
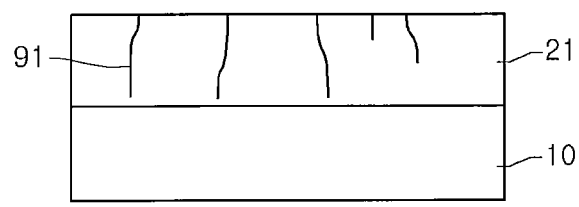
FIGS. 1 to 8 are sectional views showing a light emitting device and a method of fabricating the same according to an embodiment.

In the description of an embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device and a method of fabricating the same according to embodiments will be described in detail with reference to accompanying drawings.

FIGS. 1 to 8 are sectional views showing a light emitting device and a method of fabricating the same according to an embodiment.

Referring to FIG. 1, a first GaN layer 21 may be disposed on a substrate 10. The substrate 10 may comprise one of sapphire ($Al_2O_3$), Si, SiC, GaAs, ZnO, and MgO. For instance, a sapphire substrate may be used as the substrate 10.

The first GaN layer 21 may be doped with first conductive impurities. The first conductive impurities may comprise n type impurities, such as silicon (Si). For instance, the first GaN layer 21 may be grown by injecting TMGa gas, $SiH_4$ gas, hydrogen gas or ammonia gas into a chamber.

According to the embodiment, the first GaN layer 21 may be disposed on the substrate 10. However, a compound semiconductor layer having the compositional formula of $In_xAl_yGa_{1-x-y}N$ ($0 \leq x \leq 1$, $0 \leq y \leq 1$, $0 \leq x+y \leq 1$) may be disposed on the substrate. In this case, the compound semiconductor layer may comprise one selected from the group consisting of InAlGaN, GaN, AlGaN, InGaN, AlN, InN, and AlInN and may be doped with n type dopant, such as Si, Ge, Sn, or C.

Although not shown in the drawings, a buffer layer and an undoped GaN layer may be disposed between the substrate 10 and the first GaN layer 21.

When the first GaN layer 21 is grown on the substrate 10, a dislocation 91 may occur due to the lattice mismatch between the substrate 10 and the first GaN layer 21. The dislocation 91 may be propagated to an active layer, which will be grown later. The dislocation 91 may cause the leakage current and degrade the internal quantum efficiency or performance of the light emitting device.

Figure 2:
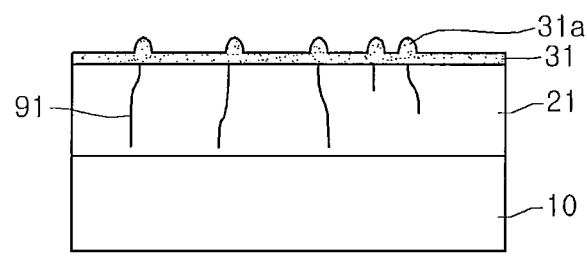

Referring to FIG. 2, a first InGaN layer 31 may be disposed on the first GaN layer 21. The first InGaN layer 31 may comprise a low-mole InGaN layer having a smaller amount of 1$n$. For instance, the first InGaN layer 31 satisfies the compositional formula of $In_xGa_{1-x}N$ ($0.02 \leq x \leq 0.05$). The first InGaN layer 31 reduces the dislocation 91 propagated through the first GaN layer 21, thereby improving the quality of the semiconductor layer. The first InGaN layer 31 may be grown under the spiral growth mode and a first island layer 31a, which is a mass of In, may be partially formed in the first InGaN layer 31.

The first InGaN layer 31 may comprise an InGaN layer doped with first conductive impurities. The first conductive impurities may comprise n type impurities, such as silicon (Si). For instance, the first InGaN layer 31 may be grown by injecting TMGa gas, TMIn gas, SiH$_4$ gas, hydrogen gas or ammonia gas into a chamber.

Figure 3:
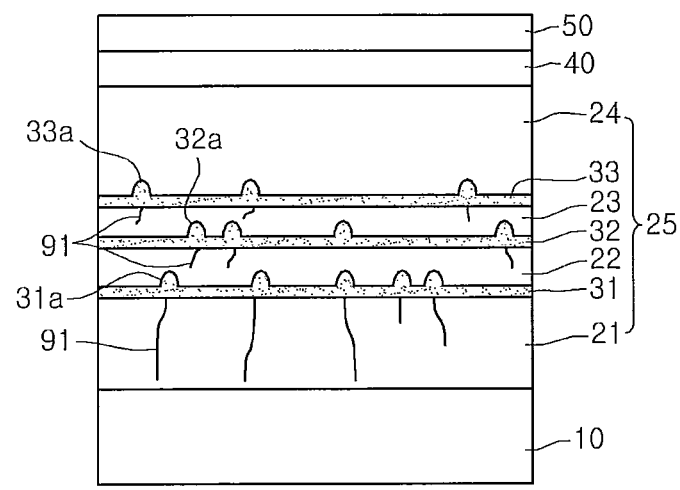

Referring to FIG. 3, a second GaN layer 22 may be disposed on the first InGaN layer 31. The second GaN layer 22 may be disposed by using a material the same as that of the first GaN layer 21. The dislocation 91 may occur in the second GaN layer 22, but the dislocation 91 may be reduced as compared with that of the first GaN layer 21.

A second InGaN layer 32 may be disposed on the second GaN layer 22. The second InGaN layer 32 may have the composition the same as that of the first InGaN layer 31. Similar to the first InGaN layer 31, a second island layer 32a is partially formed in the second InGaN layer 32.

A third GaN layer 23 may be disposed on the second InGaN layer 32. The third GaN layer 23 may be disposed by using a material the same as that of the second GaN layer 22. The dislocation 91 may occur in the third GaN layer 23, but the dislocation 91 may be reduced as compared with that of the second GaN layer 22.

A third InGaN layer 33 may be disposed on the third GaN layer 23. The third InGaN layer 33 may have the composition the same as that of the second InGaN layer 32. Similar to the second InGaN layer 32, a third island layer 33a is partially formed in the third InGaN layer 33.

A fourth GaN layer 24 may be disposed on the third InGaN layer 33. The fourth GaN layer 24 may be disposed by using a material the same as that of the third GaN layer 23. The dislocation 91 may occur in the fourth GaN layer 24, but the dislocation 91 may be reduced as compared with that of the third GaN layer 23.

In the light emitting device according to the embodiment, the GaN layers 21 to 24 and the InGaN layers 31 to 33 may constitute a first conductive semiconductor layer 25. The GaN layers 21 to 24 and the InGaN layers 31 to 33 may comprise n type impurities, such as silicon (Si).

According to the embodiment, the GaN layers 21 to 24 are stacked alternately with the InGaN layers 31 to 33, so that the propagation of the dislocation 91 can be prevented while improving the quality of the semiconductor layers disposed on the first conductive semiconductor layer 25.

The embodiment illustrates the first conductive semiconductor layer 25 comprising four GaN layers 21 to 24 and three InGaN layers 31 to 33. However, the number of the GaN layers and InGaN layers may be changed. For instance, the first conductive semiconductor layer 25 may comprise only the first GaN layer 21 and the first InGaN layer 31 or the first and second GaN layers 21 and 22 and the first InGaN layer 31, which are alternately stacked. In addition, the first conductive semiconductor layer 25 may be disposed by alternately stacking at least five GaN layers and four InGaN layers.

An active layer 40 may be disposed on the first conductive semiconductor layer 25 and a second conductive semiconductor layer 50 may be disposed on the active layer 40.

The active layer 40 may comprise one of a single quantum well structure, a multiple quantum well (MQW) structure, a quantum wire structure and a quantum dot structure. The active layer 40 may have a well/barrier layer by using group III-V semiconductor materials. For instance, the active layer 40 may comprise at least one of an InGaN/GaN structure, an InGaN/AlGaN structure and an InGaN/InGaN structure. The barrier layer may comprise a material having the band gap energy higher than that of the well layer, but the embodiment is not limited thereto. In addition, for instance, the active layer 40 may comprise a semiconductor material having the compositional formula of $In_xAl_yGa_{1-x-y}N$ ($0 \leq x \leq 1$, $0 \leq y \leq 1$, $0 \leq x+y \leq 1$).

The second conductive semiconductor layer 50 may comprise a GaN layer doped with second conductive impurities. The second conductive impurities comprise p type impurities, such as Mg. For instance, the second conductive semiconductor layer 50 may be formed by injecting TMGa gas, (EtCp$_2$Mg) {Mg(C$_2$H$_5$C$_5$H$_4$)$_2$} gas, hydrogen gas and ammonia gas into the chamber.

Figure 4:
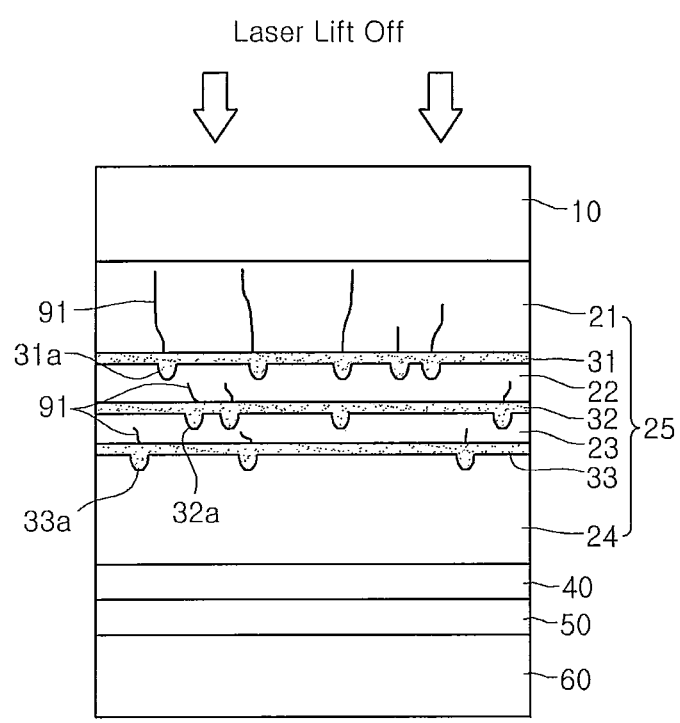

Referring to FIG. 4, the conductive support substrate 60 may be disposed on the second conductive semiconductor layer 50. The conductive support substrate 60 may comprise a metal or a semiconductor substrate. For instance, the conductive support substrate 60 may comprise at least one selected from the group consisting of Ti, Cr, Ni, Al, Pt, Au, W, Cu, Mo, Cu—W, and a carrier wafer doped with impurities and including Si, Ge, GaN, GaAs, ZnO, SiC or SiGe. The conductive support substrate 60 may be formed through a plating scheme or a bonding scheme. Although not shown in the drawings, an ohmic contact layer and/or a reflective layer may be disposed between the second conductive semiconductor layer 50 and the conductive support substrate 60.

The reflective layer may be disposed by using a metal comprising at least one of Ag, Al, Cu and Ni having high reflectance. The ohmic contact layer may comprise a transparent electrode layer. For instance, the ohmic contact layer comprises at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO. In addition, the ohmic contact layer may comprise at least one selected from the group consisting of Ag, Ni, Al, Rh, Pd, Ir, Ru, Mg, Zn, Pt, Au, Hf and a selective combination thereof.

After the conductive support substrate 60 has been disposed on the second conductive semiconductor layer 50, the substrate 10 may be removed. For instance, the substrate 10 may be removed through an LLO (laser lift off) scheme or an etching process.

Figure 5:
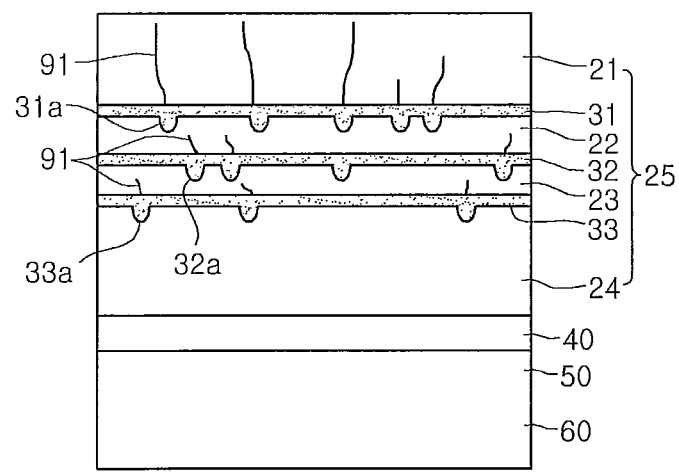

Referring to FIG. 5, the first GaN layer 21 of the first conductive semiconductor layer 25 adjacent to the substrate 10 may be exposed as the substrate 10 is removed.

If the undoped GaN layer is disposed between the substrate 10 and the first GaN layer 21, the undoped GaN layer may be exposed.

Figure 6:
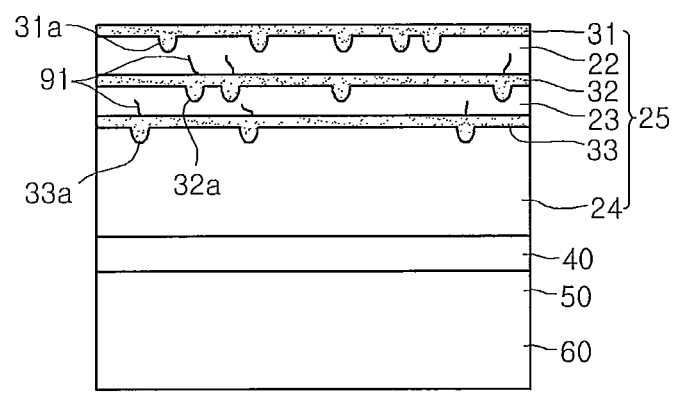
Figure 7:
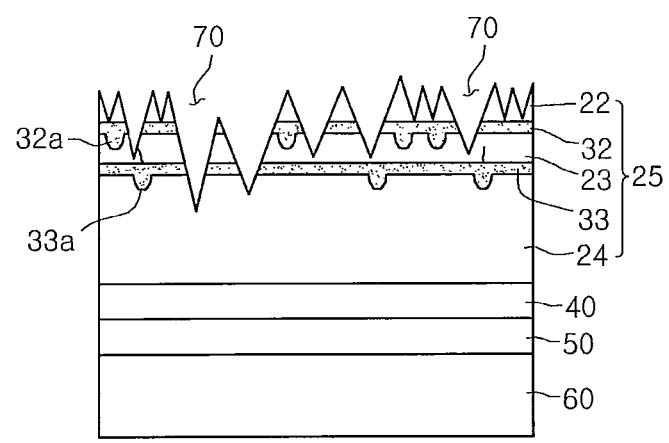

Referring to FIGS. 6 and 7, the first conductive semiconductor layer 25 may be etched by using etchant. For instance, the etchant comprises at least one of KOH, $H_3PO_4$ and $K_2S_2O_8$.

As the first conductive semiconductor layer 25 is etched through the etching process, a roughness 70 is formed on the first conductive semiconductor layer 25. At this time, the InGaN layer has the etching selectivity with respect to the GaN layer. In particular, the island layer formed on the InGaN layer is easily etched, so that the roughness on the surface of the first conductive semiconductor layer 25 is increased.

In addition, since the GaN layer and the InGaN layer are alternately stacked in the first conductive semiconductor layer 25, the etching rate may vary depending on regions of the first conductive semiconductor layer 25, so that the surface roughness may be further increased.

The first GaN layer 21 and the first InGaN layer 31 may have the defect, such as the dislocation 91, because the first GaN layer 21 and the first InGaN layer 31 are grown adjacent to the substrate 10. The first GaN layer 21 and the first InGaN layer 31 are removed through the etching process, so the fourth GaN layer 24 having the high quality mainly serves as the first conductive semiconductor layer 25. Thus, the internal quantum efficiency of the light emitting device can be increased.

Figure 8:
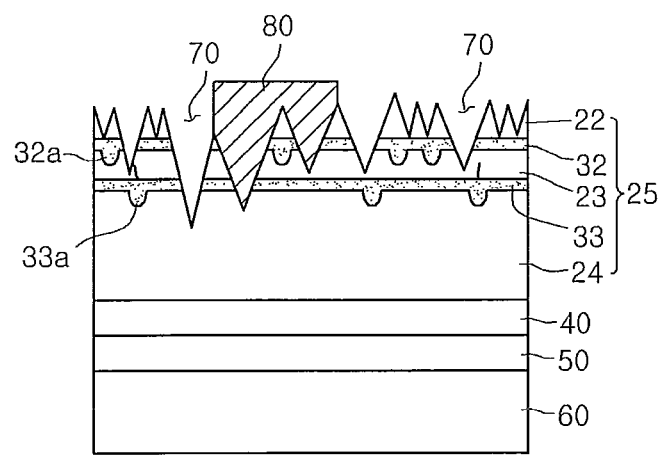

Referring to FIG. 8, an electrode layer 80 may be disposed on the first conductive semiconductor layer 25.

In this manner, the light emitting device according to the embodiment can be fabricated.

In detail, as shown in FIG. 8, the light emitting device according to the embodiment comprises the conductive support substrate 60, the second conductive semiconductor layer 50 on the conductive support substrate 60, the active layer 40 on the second conductive semiconductor layer 50, the first conductive semiconductor layer 25 on the active layer 40, and the electrode layer 80 on the first conductive semiconductor layer 25.

The conductive support substrate 60 may comprise a metal or a semiconductor substrate. For instance, the conductive support substrate 60 comprises at least one selected from the group consisting of Ti, Cr, Ni, Al, Pt, Au, W, Cu, Mo, Cu—W, and a carrier wafer doped with impurities and including Si, Ge, GaN, GaAs, ZnO, SiC or SiGe.

The reflective layer and the ohmic contact layer may be disposed between the conductive support substrate 60 and the second conductive semiconductor layer 50. The reflective layer may be formed by using a metal comprising at least one of Ag, Al, Cu and Ni having high reflectance. The ohmic contact layer may comprise a transparent electrode layer. For instance, the ohmic contact layer comprises at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, and NiO. In addition, the ohmic contact layer may comprise one selected from the group consisting of Ag, Ni, Al, Rh, Pd, Ir, Ru, Mg, Zn, Pt, Au, Hf and a selective combination thereof. The reflective layer and the ohmic contact layer are not necessarily required, but at least one of the reflective layer and the ohmic contact layer can be omitted.

The second conductive semiconductor layer 50 may comprise a GaN-based nitride semiconductor layer comprising p type impurities. The active layer 40 is a light emitting layer and comprises at least one of a single quantum well structure, a multiple quantum well (MQW) structure, a quantum wire structure and a quantum dot structure.

The first conductive semiconductor layer 25 may comprise a GaN-based nitride semiconductor layer comprising n type impurities. According to the embodiment, the first conductive semiconductor layer 25 comprises the InGaN layer and the GaN layer.

Referring to FIG. 8, the first conductive semiconductor layer 25 comprises the second GaN layer 22, the second InGaN layer 32, the third GaN layer 23, the third InGaN layer 33, and the fourth GaN layer 24.

The roughness 70 is formed on the top surface of the first conductive semiconductor layer 25. According to the embodiment, the first conductive semiconductor layer 25 comprises the InGaN layer and the GaN layer, which are alternately stacked, and the roughness 70 is formed as the second GaN layer 22, the second InGaN layer 32, the third GaN layer 23, the third InGaN layer 33, and the fourth GaN layer 24 are selectively removed.

The roughness 70 may have an inclined surface, so the second GaN layer 22, the second InGaN layer 32, the third GaN layer 23, the third InGaN layer 33, and the fourth GaN layer 24 are partially exposed in the upward direction. In addition, since a plurality of roughnesses 70 are formed while being spaced apart from each other, the second GaN layer 22, the second InGaN layer 32, the third GaN layer 23, the third InGaN layer 33, and the fourth GaN layer 24 are partially exposed in the lateral direction.

For instance, the GaN layer and the InGaN layer of the first conductive semiconductor layer 25 may be exposed in the upward direction or the lateral direction. Otherwise, a plurality of GaN layers and InGaN layers of the first conductive semiconductor layer 25 may be exposed in the upward direction or the lateral direction.

Thus, the light generated from the active layer 40 can be effectively extracted to the outside due to the roughness 70 of the first conductive semiconductor layer 25, so that the light extraction efficiency of the light emitting device can be improved. The roughness 70 may serve as a photonic crystal of the light emitting device.

The electrode layer 80 may be formed by using a metal comprising at least one of Au, Al and Pt to facilitate the wire bonding. The electrode layer 80, together with the conductive support substrate 60, supplies power to the active layer 40.

Figure 9:
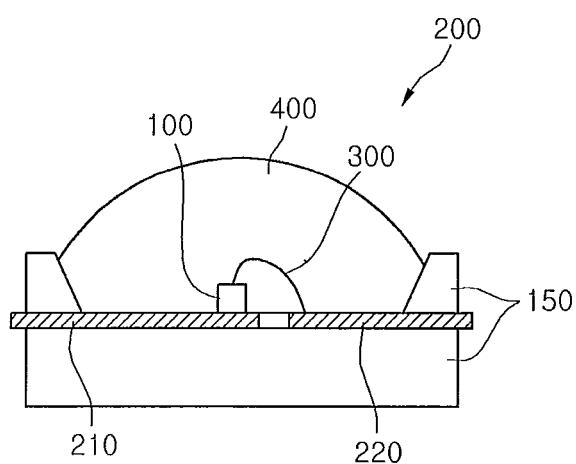
FIG. 9 is a sectional view showing a light emitting device package having a light emitting device according to an embodiment.

FIG. 9 is a sectional view showing a light emitting device package 200 comprising the light emitting device according to the embodiments.

Referring to FIG. 9, the light emitting device package 200 comprises a body 150, a first and second electrode layers 210 and 220 formed on the body 150, the light emitting device 100 provided on the body 150 and electrically connected to the first and second electrode layers 210 and 220 and a molding member 400 that surrounds the light emitting device 100.

The body 150 may comprise silicon, synthetic resin or a metallic material. An inclined surface may be formed around the light emitting device 100.

The first and second electrode layers 210 and 220 are electrically isolated from each other to supply power to the light emitting device 100. In addition, the first and second electrode layers 210 and 220 reflect the light emitted from the light emitting device 100 to improve the light efficiency and dissipate heat generated from the light emitting device 100 to the outside.

The light emitting device shown in FIG. 8 may be employed as the light emitting device 100. The light emitting device 100 may be provided on the body 150 or the first or second electrode layer 210 or 220.

The light emitting device 100 may be electrically connected to the first electrode layer 210 and/or the second electrode layer 220 through a wire 300. According to the embodiment, two wires 300 are employed.

The molding member 400 surrounds the light emitting device 100 to protect the light emitting device 100. In addition, the molding member 400 may comprise luminescent materials to change the wavelength of the light emitted from the light emitting device 100.

The light emitting device package 200 according to the embodiment employs the light emitting device 100 capable of improving the light extraction efficiency and the internal quantum efficiency, so that the light efficiency of the light emitting device package 200 can be improved.

A plurality of light emitting device or light emitting device packages according to the embodiment may be arrayed on a substrate, and an optical member comprising a light guide plate, a prism sheet, a diffusion sheet or a fluorescent sheet may be provided on the optical path of the light emitted from the light emitting device or the light emitting device package. The light emitting device or the light emitting device package, the substrate, and the optical member may serve as a backlight unit or a lighting unit. For instance, the lighting system may comprise a backlight unit, a lighting unit, an indicator, a lamp or a street lamp.

Figure 10:
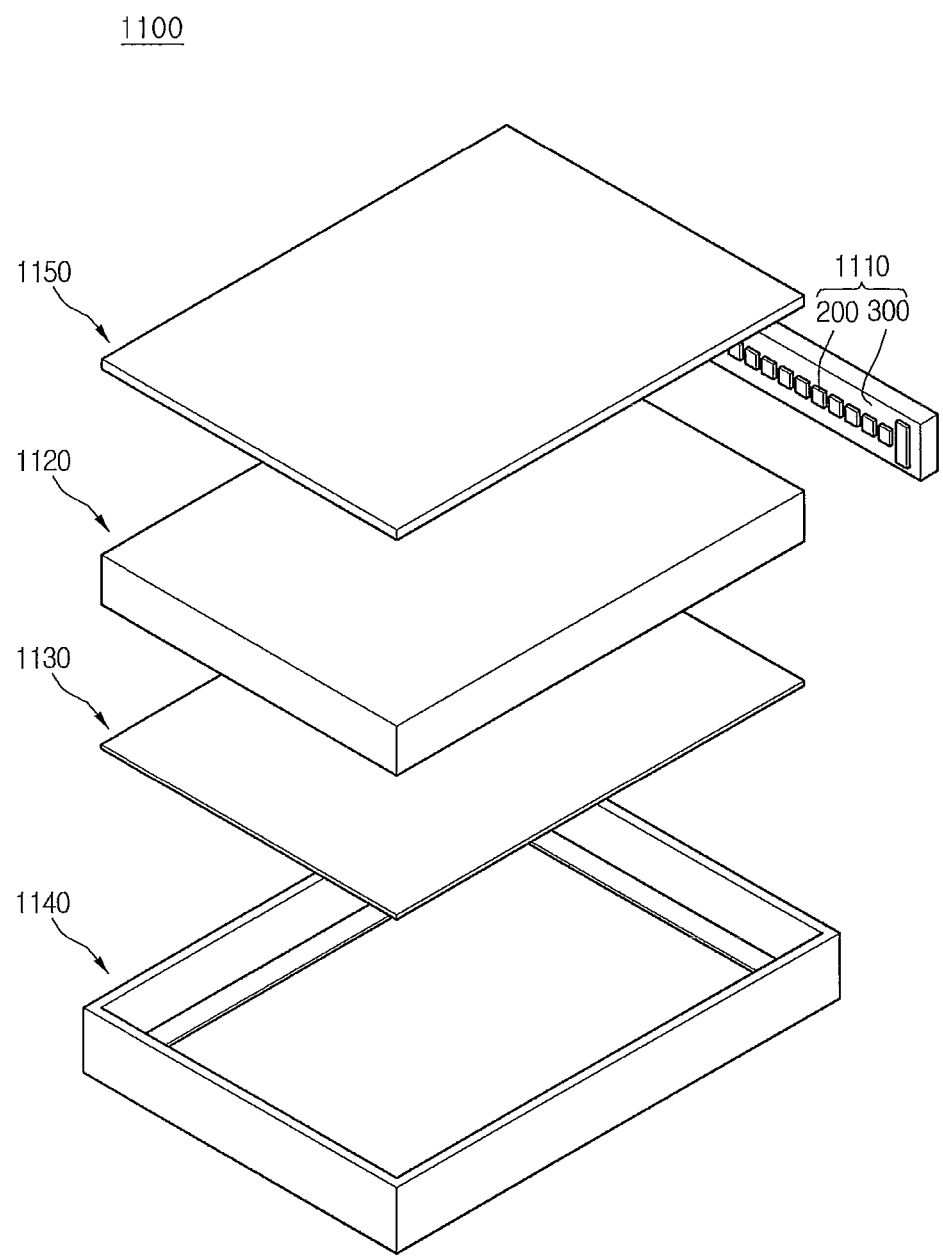
FIG. 10 is an exploded perspective view showing a backlight unit comprising a light emitting device package according to an embodiment.

FIG. 10 is an exploded perspective view showing a backlight unit 1100 comprising the light emitting device package according to the embodiment. The backlight unit 1100 shown in FIG. 10 is an example of a lighting system and the embodiment is not limited thereto.

Referring to FIG. 10, the backlight unit 1100 may comprise a bottom frame 1140, a light guide member 1120 provided in the bottom frame 1140, and a light emitting module 1110 provided at one side or on the bottom surface of the light guide member 1120. In addition, a reflective sheet 1130 may be disposed under the light guide member 1120.

The bottom frame 1140 may have a box shape having an open top surface to receive the light guide member 1120, the light emitting module 1110 and the reflective sheet 1130 therein. In addition, the bottom frame 1140 may comprise metallic material or resin material, but the embodiment is not limited thereto.

The light emitting module 1110 may comprise a substrate 300 and a plurality of light emitting devices 100 or light emitting device packages 200 provided on the substrate 300. The light emitting devices 100 or the light emitting device packages 200 can supply light to the light guide member 1120. According to the embodiment, the light emitting device packages 200 are provided on the substrate 300.

As shown in FIG. 10, the light emitting module 1110 is provided on at least one inner side of the bottom frame 1140 to provide the light to at least one side of the light guide member 1120.

In addition, the light emitting module 1110 may be provided under the bottom frame 1140 to provide the light toward the bottom surface of the light guide member 1120. Such an arrangement may be variously changed according to the design of the backlight unit 1100, and the embodiment is not limited thereto.

The light guide member 1120 is provided in the bottom frame 1140. The light guide member 1120 converts the light emitted from the light emitting module 1110 into the surface light to guide the surface light toward the display panel.

The light guide member 1120 may comprise a light guide plate. For instance, the light guide plate may be fabricated by using acryl-based resin, such as PMMA (polymethyl methacrylate), PET (polyethylene terephthalate), COC, PC (polycarbonate) or PEN (polyethylene naphthalate) resin.

An optical sheet 1150 may be provided over the light guide member 1120.

The optical sheet 1150 may comprise at least one of a diffusion sheet, a light collection sheet, a brightness enhanced sheet, and a fluorescent sheet. For instance, the optical sheet 1150 may have a stack structure of the diffusion sheet, the light collection sheet, the brightness enhanced sheet, and the fluorescent sheet. In this case, the diffusion sheet 1150 uniformly diffuses the light emitted from the light emitting module 1110 such that the diffused light can be concentrated onto the display panel by the light collection sheet. The light output from the light collection sheet is randomly polarized and the brightness enhanced sheet increases the degree of polarization of the light output from the light collection sheet. The light collection sheet may comprise a horizontal and/or vertical prism sheet. In addition, the brightness enhanced sheet may comprise a dual brightness enhancement film and the fluorescent sheet may comprise a transmittive plate or a transmittive film comprising luminescence materials.

The reflective sheet 1130 may be disposed under the light guide member 1120. The reflective sheet 1130 reflects the light, which is emitted through the bottom surface of the light guide member 1120, toward the light exit surface of the light guide member 1120.

The reflective sheet 1130 may comprise a resin material having a high reflectance, such as PET, PC or PVC resin, but the embodiment is not limited thereto.

Figure 11:
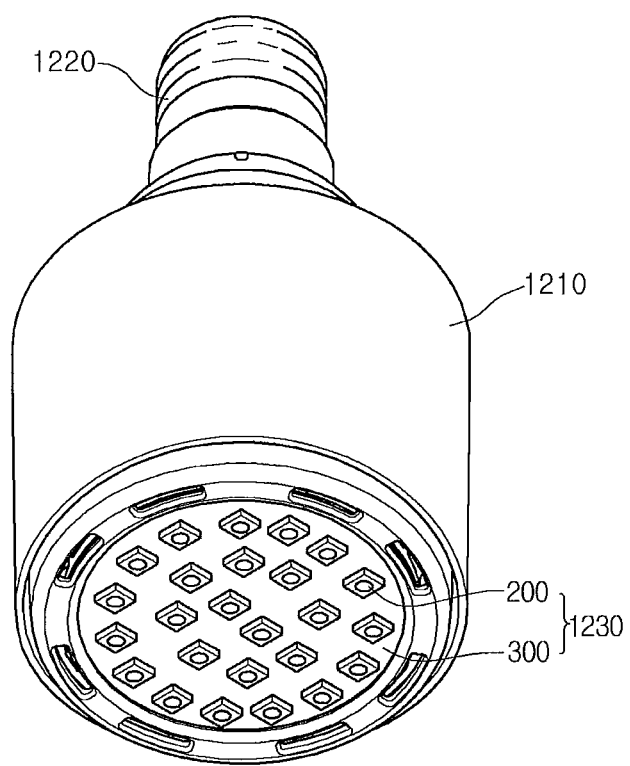
FIG. 11 is a perspective view showing a lighting system comprising a light emitting device package according to an embodiment.

FIG. 11 is a perspective view showing a lighting unit 1200 comprising the light emitting device package according to the embodiment. The lighting system 1200 shown in FIG. 11 is only one example and the embodiment is not limited thereto.

Referring to FIG. 11, the lighting system 1200 comprises a case body 1210, a light emitting module 1230 provided in the case body 1210, and a connection terminal 1220 provided in the case body 1210 to receive power from an external power source.

Preferably, the case body 1210 comprises a material having superior heat dissipation property. For instance, the case body 1210 comprises a metallic material or a resin material.

The light emitting module 1230 may comprise the board 300 and at least one light emitting device 100 or light emitting device package 200 provided on the board 300.

The board 300 comprises an insulating member printed with a circuit pattern. For instance, the board 300 comprises a PCB (printed circuit board), an MC (metal core) PCB, a flexible PCB, or a ceramic PCB.

In addition, the board 300 may comprise a material that effectively reflects the light. The surface of the board 300 may be coated with a color, such as a white color or a silver color, to effectively reflect the light.

At least one light emitting device 100 or light emitting device package 200 may be provided on the board 300. Each light emitting device package 200 may comprise at least one light emitting device 100. The light emitting device 100 may comprise a colored LED that emits the light having the color of red, green, blue or white and a UV (ultraviolet) LED that emits UV light.

The light emitting module 1230 can be variously combined to provide various colors and brightness. For instance, the white LED, the red LED and the green LED may be combined to achieve the high color rendering index (CRI). In addition, a fluorescent sheet may be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may comprise a yellow luminescence material. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 11, the connection terminal 1220 may have a shape of a socket screw-coupled with the external power source, but the embodiment is not limited thereto. For instance, the connection terminal 1220 may be prepared in the form of a pin inserted into the external power source or connected to the external power source through a wire.

According to the lighting system as described above, at least one of the light guide member, the diffusion sheet, the light collection sheet, the brightness enhanced sheet and the fluorescent sheet may be provided in the path of the light emitted from the light emitting module, so that the desired optical effect can be achieved.

As described above, the lighting system comprises the light emitting device according to the embodiments, so the lighting system can emit the light with less color variation and high light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support substrate;
a second conductive semiconductor layer on the conductive support substrate;
an active layer on the second conductive semiconductor layer;
a first conductive semiconductor layer on the active layer, the first conductive semiconductor layer comprising a GaN layer, an InGaN layer, and a roughness formed with the GaN and InGaN layers; and
an electrode layer on the first conductive semiconductor layer,
wherein the first conductive semiconductor layer comprises a plurality of GaN layers and InGaN layers, which are alternately stacked.

2. The light emitting device of claim 1, further comprising at least one of a reflective layer and an ohmic contact layer between the conductive support substrate and the second conductive semiconductor layer.

3. The light emitting device of claim 1, wherein at least a part of the GaN layer and at least a part of the InGaN layer are exposed in an upward direction.

4. The light emitting device of claim 1, wherein at least a part of the GaN layer and at least a part of the InGaN layer are exposed in a lateral direction by the roughness.

5. The light emitting device of claim 1, wherein the conductive support substrate comprises at least one selected from the group consisting of Ti, Cr, Ni, Al, Pt, Au, W, Cu, Mo, Cu—W, Si, Ge, GaN, GaAs, ZnO, SiC and SiGe.

6. The light emitting device of claim 2, wherein the reflective layer comprises at least one of Ag, Al, Cu, and Ni.

7. The light emitting device of claim 2, wherein the ohmic contact layer comprises at least one selected from the group consisting of ITO (Indium Tin Oxide), IZO (Indium Zinc Oxide), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Ag, Ni, Al, Rh, Pd, Ir, Ru, Mg, Zn, Pt, Au, Hf and a selective combination thereof.

8. The light emitting device of claim 1, wherein the InGaN layer satisfies a compositional formula: $In_xGa_{1-x}N$ ($0.02 \leq x \leq 0.05$).

9. A light emitting device package comprising:
a body;
a first and second electrode layers on the body;
a light emitting device electrically connected to the first and second electrode layers on the body; and
a molding member surrounding the light emitting device on the body,
wherein the light emitting device comprises:
a conductive support substrate;
a second conductive semiconductor layer on the conductive support substrate;
an active layer on the second conductive semiconductor layer;
a first conductive semiconductor layer on the active layer, the first conductive semiconductor layer comprising a GaN layer, an InGaN layer, and a roughness formed with the GaN and InGaN layers; and
an electrode layer on the first conductive semiconductor layer, and
wherein the first conductive semiconductor layer comprises a plurality of GaN layers and InGaN layers, which are alternately stacked.

10. The light emitting device package of claim 9, wherein at least a part of the GaN layer and at least a part of the InGaN layer are exposed in an upward direction.

11. The light emitting device package of claim 9, wherein at least a part of the GaN layer and at least a part of the InGaN layer are exposed in a lateral direction by the roughness.

12. The light emitting device package of claim 9, further comprising at least one of a reflective layer and an ohmic contact layer between the conductive support substrate and the second conductive semiconductor layer.

13. The light emitting device package of claim 9, wherein the InGaN layer satisfies a compositional formula: $In_xGa_{1-x}N$ ($0.02 \leq x \leq 0.05$).

14. A lighting system comprising:
    a board; and
    a light emitting module comprising a light emitting device on the board,
    wherein the light emitting device comprises:
    a conductive support substrate;
    a second conductive semiconductor layer on the conductive support substrate;
    an active layer on the second conductive semiconductor layer;
    a first conductive semiconductor layer on the active layer, the first conductive semiconductor layer comprising a GaN layer, an InGaN layer, and a roughness formed with the GaN and InGaN layers; and
    an electrode layer on the first conductive semiconductor layer, and
    wherein the first conductive semiconductor layer comprises a plurality of GaN layers and InGaN layers, which are alternately stacked.

15. The lighting system of claim 14, further comprising at least one of a light guide member, a diffusion sheet, a light collection sheet, a brightness enhanced sheet and a fluorescent sheet aligned on a path of a light emitted from the light emitting module.

16. The lighting system of claim 14, wherein at least a part of the GaN layer and at least a part of the InGaN layer are exposed in an upward direction.

17. The lighting system of claim 14, wherein at least a part of the GaN layer and at least a part of the InGaN layer are exposed in a lateral direction by the roughness.

* * * * *